United States Patent
Nelson et al.

(10) Patent No.: US 10,325,840 B2
(45) Date of Patent: Jun. 18, 2019

(54) METAL ON BOTH SIDES WITH POWER DISTRIBUTED THROUGH THE SILICON

(71) Applicant: Intel Corporation, Santa Clara, CA (US)

(72) Inventors: Donald W. Nelson, Beaverton, OR (US); Mark T. Bohr, Aloha, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/747,988

(22) PCT Filed: Sep. 25, 2015

(86) PCT No.: PCT/US2015/052445
§ 371 (c)(1),
(2) Date: Jan. 26, 2018

(87) PCT Pub. No.: WO2017/052641
PCT Pub. Date: Mar. 30, 2017

(65) Prior Publication Data
US 2018/0218973 A1    Aug. 2, 2018

(51) Int. Cl.
*H01L 23/50* (2006.01)
*H01L 23/498* (2006.01)
(Continued)

(52) U.S. Cl.
CPC .... *H01L 23/49827* (2013.01); *H01L 23/5286* (2013.01); *H01L 28/00* (2013.01); *H01L 2224/16227* (2013.01)

(58) Field of Classification Search
CPC .......... H01L 23/49827; H01L 23/5286; H01L 28/00
(Continued)

(56) References Cited

U.S. PATENT DOCUMENTS 8,487,444 B2 *  7/2013  Law ................. H01L 21/76898
                                                  257/686
8,659,152 B2 *  2/2014  Fujita ............... H01L 21/30655
                                                  257/737

(Continued)

OTHER PUBLICATIONS

International Search Report and Written Opinion for International Patent Application No. PCT/US2015/052445 dated May 31, 2016, 7 pgs.

(Continued)

*Primary Examiner* — Luan C Thai
(74) *Attorney, Agent, or Firm* — Schwabe, Williamson & Wyatt, P.C.

(57) ABSTRACT

An apparatus including a circuit structure including a device stratum; and a contact coupled to a supply line and routed through the device stratum and coupled to at least one device on a first side. A method including providing a supply from a package substrate to at least one transistor in a device stratum of a circuit structure; and distributing the supply to the at least one transistor using a supply line on an underside of the device stratum and contacting the at least one transistor on a device side by routing a contact from the supply line through the device stratum. A system including a package substrate, and a die including at least one supply line disposed on an underside of a device stratum and routed through the device stratum and coupled to at least one of a plurality of transistor devices on the device side.

26 Claims, 11 Drawing Sheets

(51) Int. Cl.
*H01L 23/528* (2006.01)
*H01L 49/02* (2006.01)

(58) Field of Classification Search
USPC .......................................................... 257/690
See application file for complete search history.

(56) References Cited

U.S. PATENT DOCUMENTS

| | | |
|---|---|---|
| 9,184,110 B2 * | 11/2015 | Kawa ................ H01L 21/76898 |
| 2007/0275533 A1 | 11/2007 | Vaed et al. |
| 2010/0193905 A1 | 8/2010 | Kim et al. |
| 2012/0126318 A1 | 5/2012 | Kadow et al. |
| 2014/0346624 A1 | 11/2014 | Shoji et al. |
| 2015/0069520 A1 | 3/2015 | Lee |

OTHER PUBLICATIONS

International Preliminary Search Report for International Patent Application No. PCT/US2015/052445, dated Apr. 5, 2018, 6 pages.

* cited by examiner form the structure illustrated in FIG. 8.

METAL ON BOTH SIDES WITH POWER DISTRIBUTED THROUGH THE SILICON

CROSS-REFERENCE TO RELATED APPLICATION

This patent application is a U.S. National Phase Application under 35 U.S.C. § 371 of International Application No. PCT/US2015/052445, filed Sep. 25, 2015, entitled "METAL ON BOTH SIDES WITH POWER DISTRIBUTED THROUGH THE SILICON," which designates the United States of America, the entire disclosure of which is hereby incorporated by reference in its entirety and for all purposes.

TECHNICAL FIELD

Semiconductor devices including devices including electrical connections from a backside of the device.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Future circuit devices, such as central processing unit devices, will desire both high performance devices and low capacitance, low power devices integrated in a single die or chip.

DETAILED DESCRIPTION

The embodiments described herein are directed to semiconductor devices including non-planar semiconductor devices (e.g., three-dimensional devices) having interconnects or wiring on an underside or backside of the devices, particularly interconnects providing power to core logic circuitry. The distribution of power is described with power wires or lines ($V_{DD}$, $V_{DD}$-gated, and $V_{SS}$) under a device layer of a circuit structure. In one embodiment, an apparatus is described including a circuit structure including a device stratum comprising a plurality of transistor devices each comprising a first side and an opposite second side; a supply line disposed on the second side of the structure; and a contact connected to the supply line and routed through the device stratum and connected to at least one of the plurality of transistor devices on the first side. In another embodiment, a method is described. The method includes providing a supply from a package substrate to at least one transistor in a device layer of a circuit structure, the at least one transistor having a device side and an underside. The method also includes distributing the supply to the at least one transistor using a supply line on an underside of the device layer and contacting the at least one transistor on a device side by routing a contact from the supply line through the device stratum. A system is further described, the system including a package substrate including a supply connection, and a die comprising: (i) a plurality of transistors arranged in a cell operable to perform a function, the plurality of transistors defining a device layer having a device side and an underside; and (ii) at least one supply supply line disposed on an underside of the device layer and routed through the device stratum and coupled to at least one of the plurality of transistor devices on the device side.

Figure 1:
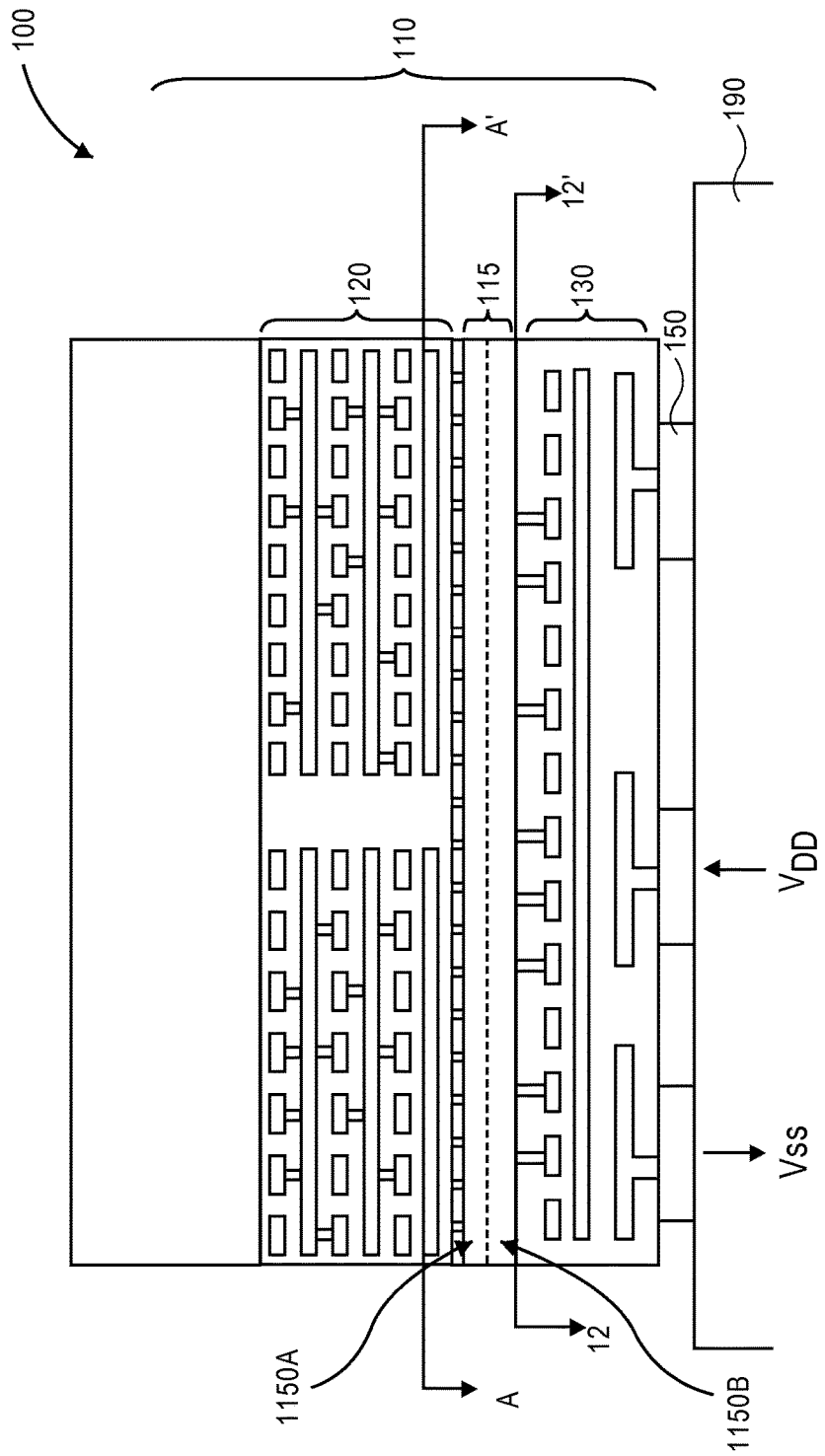
FIG. 1 shows a cross-sectional schematic side view of one embodiment of an assembly including an integrated circuit chip or die connected to a package substrate.

FIG. 1 shows a cross-sectional schematic side view of one embodiment of an assembly including an integrated circuit chip or die connected to a package substrate. Assembly 100 includes die 110 that includes device layer or stratum 115 including a number of devices (e.g., transistor devices). Device stratum 115 includes first side 1150A representing a first side or device side of the stratum and second side or backside or underside 1150B opposite first side 1150A. The transistor devices may include one or more power transistors (also referenced herein as power gates) and logic circuitry. Connected to device stratum 115 of die 110 on a first side are interconnects 120 that, in one embodiment, include, but are not limited to, a number of conductive metal lines connected to devices of device stratum 115 from first side 1150A. Included among the interconnects are control circuitry interconnects. Disposed above signal wiring 120, as viewed, is carrier substrate 140. In one embodiment, as will be described below, carrier substrate 140 is bonded to signal wiring 120 in a process of forming die 110 with metallization on both sides of the logic circuitry. Connected to devices of die 110 through second side 1150B of the die, in this embodiment, are power interconnects ($V_{DD}$, $V_{DD}$-gated and $V_{SS}$). Interconnects 130 on second side or backside 1150B include one or more rows of metallization. Ones of such metallization are connected to contact points (e.g., C4 bumps) 150 that are operable to connect die 110 to package 190. FIG. 1 also shows $V_{DD}$ and $V_{SS}$ connections to die 110 through package substrate 190.

Figure 2:
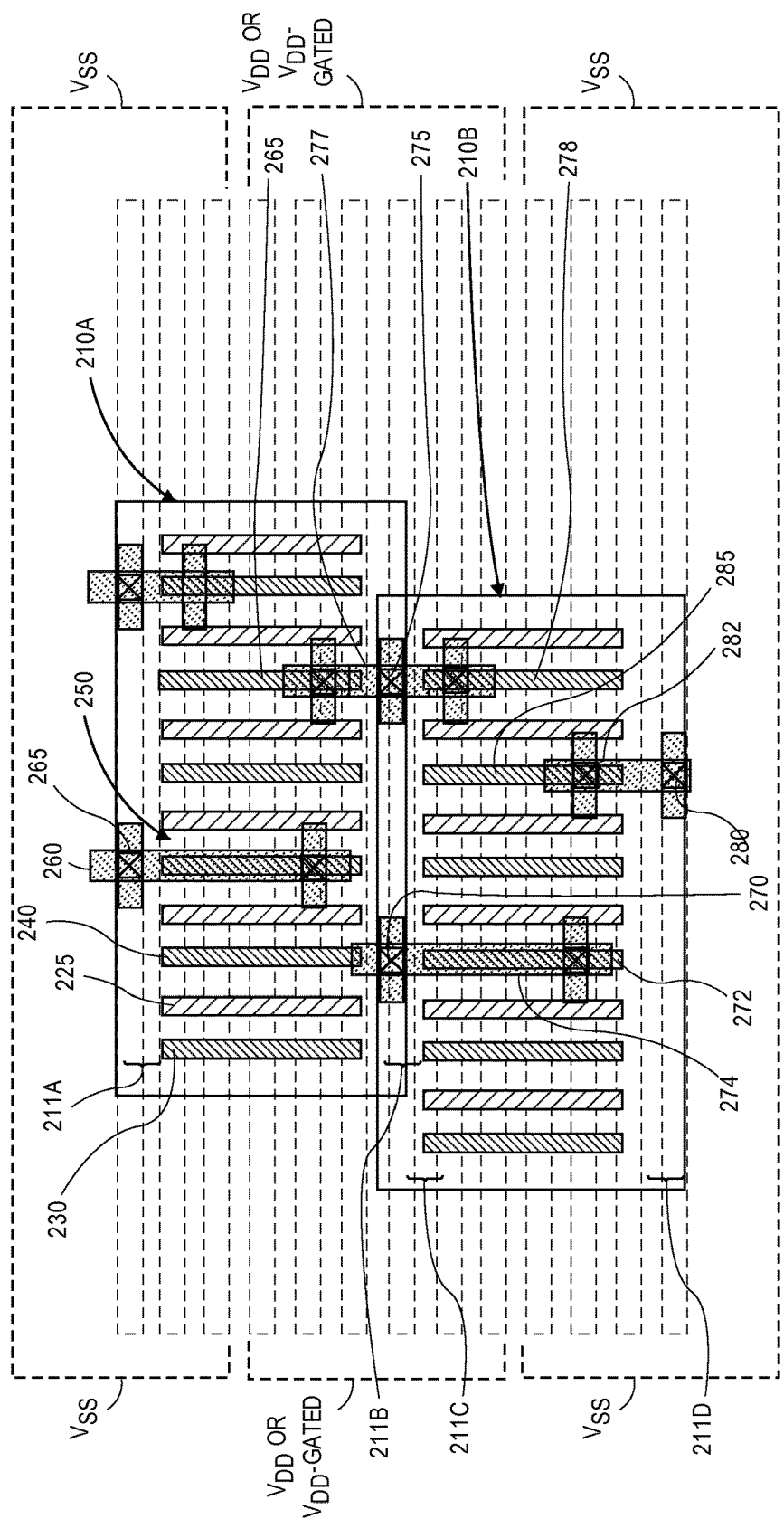
FIG. 2 shows a cross-sectional side view of a portion of the die through line A-A'.

FIG. 2 shows a cross-sectional side view of a portion of die 110 through line A-A'. FIG. 2 shows a top-down view of two placed cells (defined by dashed lines) of devices of the die containing gate electrode and source and drain contact metal. The cross-section in this illustration is taken above M1 (i.e., showing examples of M1 routing). Generally speaking, integrated circuit structures are made up of many cells that each performs basic functions. Examples of cell types include logic gates (e.g., AND gates, OR gates), cells of flip-flops, adders, counters, etc. When designing an integrated circuit having specific functions, circuit cells that can perform or realize the functions are selected and designers draw a layout design of the integrated circuit containing each of the selected circuit cells. The layout is then implemented to incorporate each of the cells in building the die. In the embodiment shown in FIG. 2, cell 210A and cell 210B each include a number of transistor devices that perform certain functions. The cells can have different cell widths (in terms of the number of transistors that extend between the ends of the cells measured from top to bottom as viewed) depending on their function. Contacts (e.g., metal) to the transistor devices are shown as gate electrode contacts 225, source contact 230 and drain contact 240. The transistor devices of cell 210A and cell 210B are connected to a power source (e.g., $V_{DD}$ or $V_{DD}$-gated, $V_{SS}$). In this embodiment, the power source is provided under the device stratum and is routed to the devices of cell 210A and cell 210B through insulator sites or regions in each cell. FIG. 2 shows representative power lines of $V_{SS}$ and $V_{DD}$ or $V_{DD}$-gated lines that run under the device stratum. Connected to individual ones of the $V_{SS}$ and $V_{DD}$ or $V_{DD}$-gated lines are conductive vias or contacts that extend from the respective power lines to a first side of the device stratum through insulator sites in the cells. In this example, the insulator sites or regions are associated with the walls at ends of cells 210A and 210B (illustrated as regions 211A and 211B of cell 210A and regions 211C and 211D of cell 210B), respectively, but it is appreciated that such insulator sites or regions may be at other locations in a cell. FIG. 2 shows conductive via or contact 265 connected to $V_{SS}$ in cell 210A and contact 280 connected to $V_{SS}$ in cell 210B. FIG. 2 also shows contact 270 and contact 275 to $V_{DD}$ or $V_{DD}$-gated. Each of contacts 265, 270, 275 and 280 extend through the device stratum so that such contacts may be contacted by M0 metallization. Metallization or interconnects on the device side of the stratum are used to route the contacts to the appropriate connection point for the cell to connect devices to power lines from the device side. FIG. 2 shows interconnect 260 (e.g., M0 or M1 metallization) connected to contact 265 and to drain contact 250 in cell 210A; interconnect 277 connected to contact 275 and source contact 277 in cell 210A and source contact 278 in cell 210B; interconnect 274 connected to contact 270 and source contact 272 in cell 210B; and interconnect 285 connected to contact 280 and drain contact 282 in cell 210B.

Figure 3:
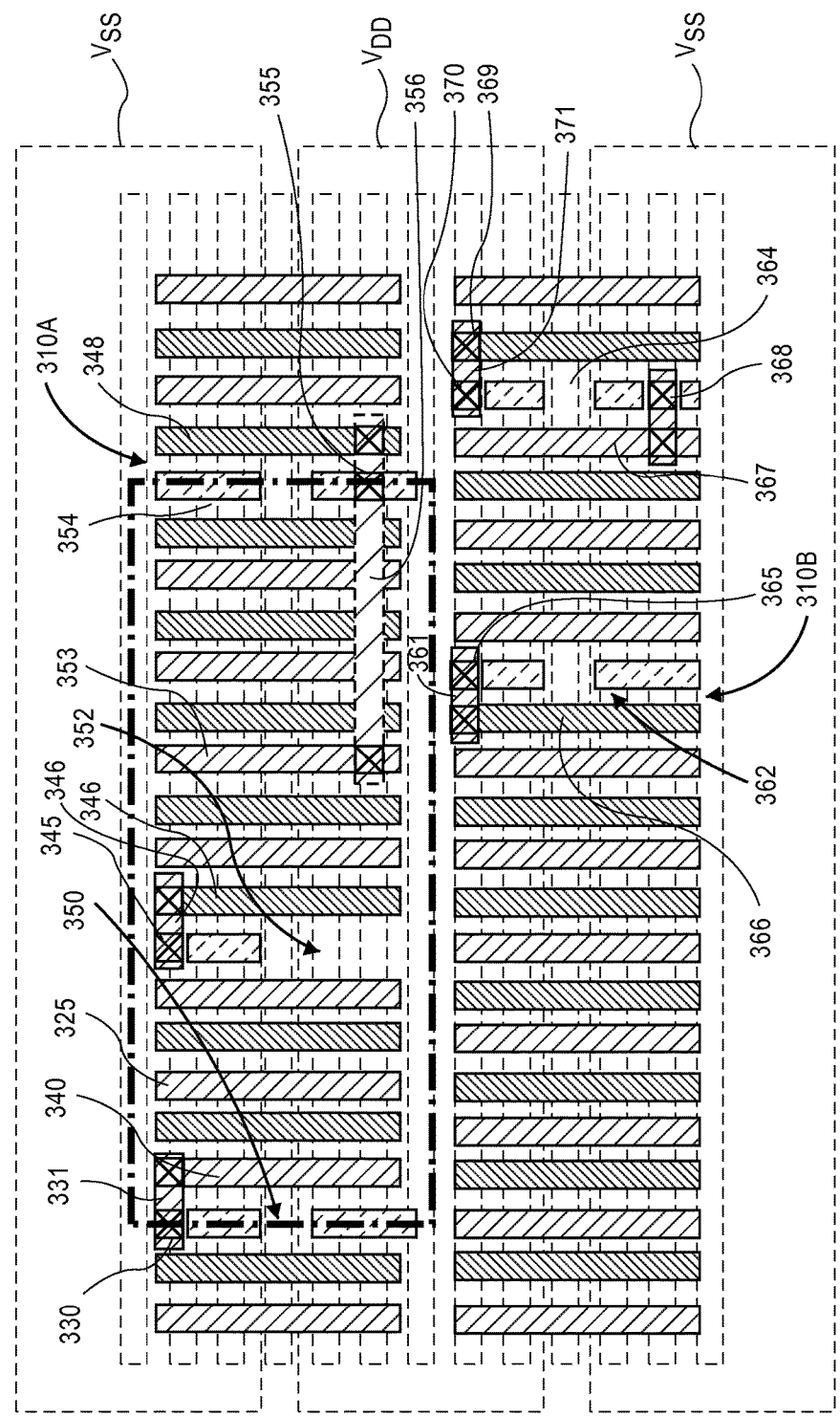
FIG. 3 shows a cross-sectional side view of a portion of the die through line A-A' according to a second embodiment.

FIG. 3 shows a cross-sectional side view of a portion of die 110 through line A-A' according to a second embodiment. FIG. 3 shows a top-down view of cell 310A and cell 310B of the die and shows gate electrode and source and drain contact metal. In this embodiment, representative power lines of $V_{SS}$ and $V_{DD}$ or $V_{DD}$-gated lines are illustrated that run under the device stratum. Connected to individual ones of the $V_{SS}$ and $V_{DD}$ or $V_{DD}$-gated lines are conductive vias or contacts that extend from the respective power lines to a first side of the device stratum through insulator sites in the cells. In this example, the insulator sites are unused gate electrode sites or regions (i.e., regions where no gate electrode is placed in the cell and no gate electrode contact is present either because no gate electrode was ever formed at the site or, if one was formed, it was removed by, for example, an etch process and replaced with dielectric material). FIG. 3 representatively shows unused gate electrode sites or regions 350, 352 and 354 in cell 310A and unused gate electrode sites or regions 362 and 364 in cell 310B. Contacts or conductive vias 330, 345 and 355 are extended through the device stratum in the unused gate electrode regions so that such contacts may be contacted by M0 metallization in cell 310A and contacts 365, 368 and 369 extend through the device stratum in cell 310B. Conductive via or contact 330 is connected to $V_{SS}$ under the device stratum in cell 310A and is representatively connected through M0 interconnect 331 to drain 340 and contact 345 is connected to $V_{SS}$ under the device stratum and connected through an M0 interconnect to drain 346 in cell 310A. FIG. 3 also shows contact 355 connected to $V_{DD}$ or $V_{DD}$-gated under the device stratum and to source 348 and/or gate electrode 353 through M0 interconnects in cell 310A. Contact 365 is connected to $V_{DD}$ or $V_{DD}$-gated under the device stratum and to source 366 through M0 interconnect 361 in cell 310B; contact 368 connected to $V_{SS}$ under the device stratum and connected through M0 interconnect 363 to drain 367 in cell 310B; and contact 370 is connected to $V_{DD}$ or $V_{DD}$-gated under the device stratum and connected through M0 interconnect 371 to drain 370 in cell 310B.

Figure 4:
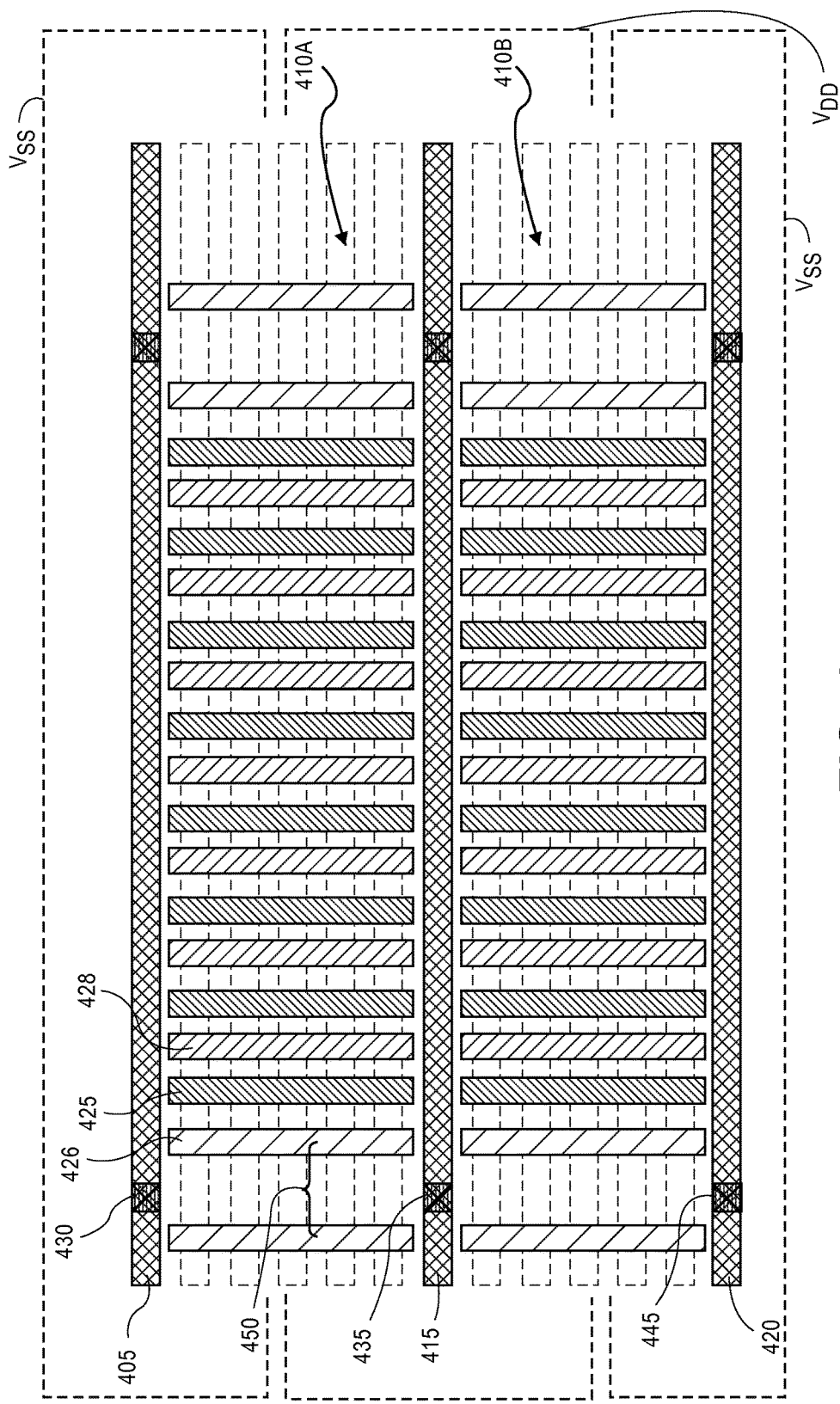
FIG. 4 shows a cross-sectional side view of a portion of the die through line A-A' according to a third embodiment.

In the embodiments described with reference to FIG. 2 and FIG. 3, contacts or conductive vias were routed through a device stratum at insulator sites or regions within particular cells. Because the contacts or vias are within a cell, the contacts are part of the cell architecture and move with the cell wherein it might be placed in a design layout rather than having to position a cell on a grid. FIG. 4 shows a cross-sectional side view of a portion of die 110 through line A-A' according to a third embodiment. In this embodiment, contacts from $V_{DD}$ or $V_{DD}$-gated and $V_{SS}$ are brought through the device stratum in regions adjacent a circuit cell. FIG. 4 shows cell 410A and cell 410B each illustrated with gate electrode contacts (e.g., gate electrode contact 425, source contact 426 and drain contact 428 in cell 410A). Adjacent cells 410A and 410B are contacts to power lines under the device stratum. The contacts at a device side of the device stratum may be connected to transistor devices through connections at the M0 level as described above. FIG. 4 representatively shows contact 430 connected to $V_{SS}$ under the device stratum and to M0 interconnect 405; contact 435 connected to $V_{DD}$ or $V_{DD}$-gated under the device stratum and to M0 interconnect 415; and contact 445 connected to $V_{SS}$ under the device stratum and to M0 interconnect 420. The power lines (M0 interconnect 410, M0 interconnect 415 and M0 interconnect 420 are in the form of a grid between which cells 410A and 410B are positioned). Since the contacts to the power lines are brought through regions of the device stratum to connect to this grid adjacent the circuit cells, circuit cell 410A and circuit cell 410B are constructed to fit in the grid. FIG. 4 also indicates locations or areas (e.g., area 450) where it may not be desirable to locate logic transistors.

Figure 5:
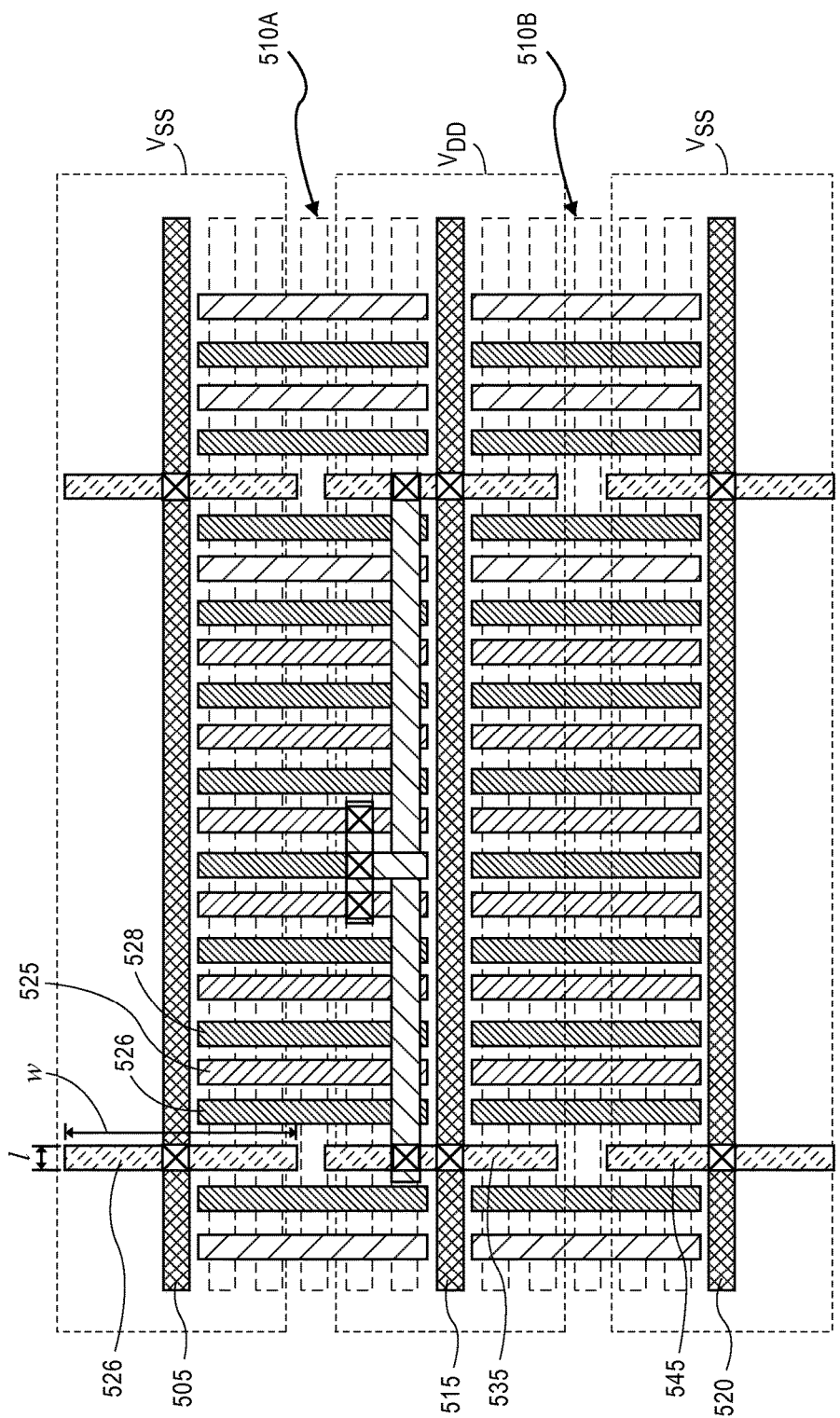
FIG. 5 shows a cross-sectional side view of a portion of the die through line A-A' according to a fourth embodiment where the resistance is decreased by using larger area conductive contacts or vias to connect the device side interconnects and to power lines under a device stratum.

In the embodiment described with reference to FIG. 4, there is an opportunity for voltage drop in distributing power along the interconnects. FIG. 5 shows a cross-sectional side view of a portion of die 110 through line A-A' according to a fourth embodiment where the resistance is decreased by using larger area conductive contacts or vias to connect the device side interconnects and to power lines under a device stratum. In this embodiment, contacts from $V_{DD}$ or $V_{DD}$-gated and $V_{SS}$ are again brought through the device stratum in regions adjacent a circuit cell. FIG. 5 shows cell 510A and cell 510B each illustrated with gate electrode contacts (e.g., gate electrode contact 525, source contact 526 and drain contact 528 in cell 510A). Adjacent cells are power lines under the device stratum. FIG. 5 representatively shows contact or via 530 connected to $V_{SS}$ under the device stratum and to M0 interconnect 505; contact 535 connected to $V_{DD}$ or $V_{DD}$-gated under the device stratum and to M0 interconnect 515; and contact 545 connected to $V_{SS}$ and to M0 interconnect 520. In this example, contacts 530, 535 and 545 are formed as slots having a length (l) less than a width (w) (e.g., length is ⅛, ⅕, ¼, ⅓ the width).

Figure 6:
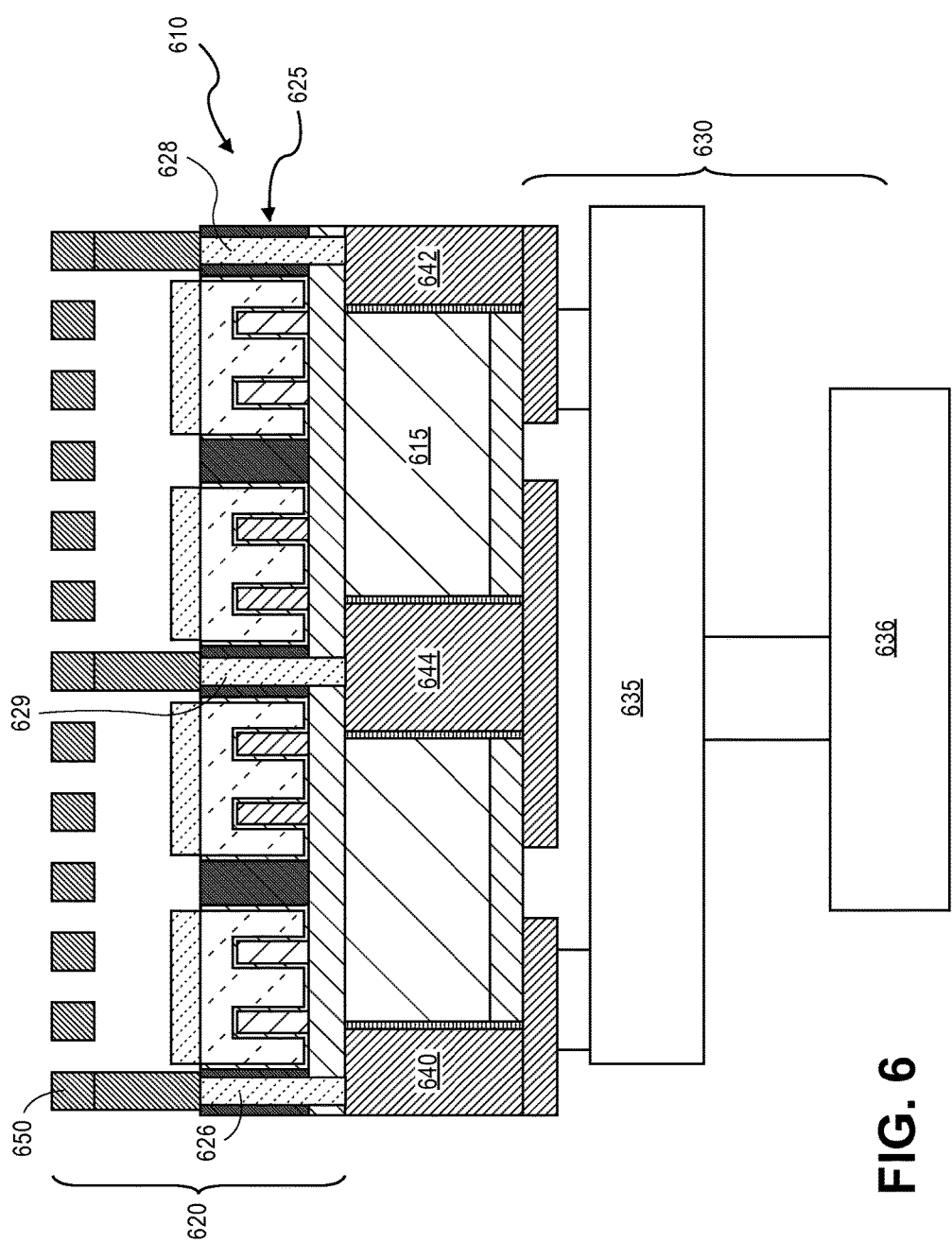
FIG. 6 shows a cross-sectional schematic side view of a portion of an integrated circuit die including backside or underside metallization in an embodiment in which power lines are routed from the backside through the device stratum to a device side for connection to devices.

FIG. 6 shows a cross-sectional schematic side view of a portion of an integrated circuit die including backside or underside metallization in an embodiment in which power lines are routed from the backside to a device side of the die. In the illustration, dielectric material layers are removed. Die 610 includes substrate 615 of a semiconductor material such as silicon. Disposed on a first side or device side 620 of substrate 615 is device layer or stratum 625 including a number of transistor devices. Disposed on a second or underside or backside of substrate 615 is backside metallization 630. In the embodiment shown in FIG. 6, through silicon vias (TSVs) are utilized to connect backside metallization 630 (notably $V_{DD}$, $V_{DD}$-gated and $V_{SS}$) to a device side of the die. FIG. 6 shows TSV 640 and TSV 642 that are utilized to bring $V_{DD}$ or $V_{DD}$-gated power from the backside to the device side of the die and TSV 644 to connect to $V_{SS}$. TSVs 640, 642 and 644 may be formed at the wafer level prior to device fabrication by a reactive-ion etching process to form the openings, followed by lining the openings with an isolation material (e.g., silicon dioxide) and an adhesion layer (e.g., titanium/tungsten), seeding and filling the openings with a material such as copper by an electroplating process. Prior to forming the TSVs, the wafer may be thinned by, for example, a mechanical grinding process.

FIG. 6 shows vias 640 and 642 connected to two levels of backside metallization, represented by backside interconnect 635 and backside interconnect 636. It is appreciated that the number of backside metallization levels will depend on the requirements of the die. On a device side, FIG. 6 shows contacts 626, 628 and 629 connected to TSVs 640, 642 and 644, respectively and extending through a device stratum in insulation regions of a cell. Contacts 626, 628 and 629 may then be connected to metal layers and routed as desired. In FIG. 6, each of contacts 626, 628 and 629 is connected to interconnects in metallization level 650 (e.g., M0 level). In the embodiment of FIG. 6, TSVs 640, 642, and 644 are illustrated as larger in terms of diameter or cross-sectional area than a diameter or cross-sectional area of contacts 426, 428 and 429 (e.g., twice as large, three times as large). The larger area of the TSVs provides a landing area for the contacts.

Figure 7:
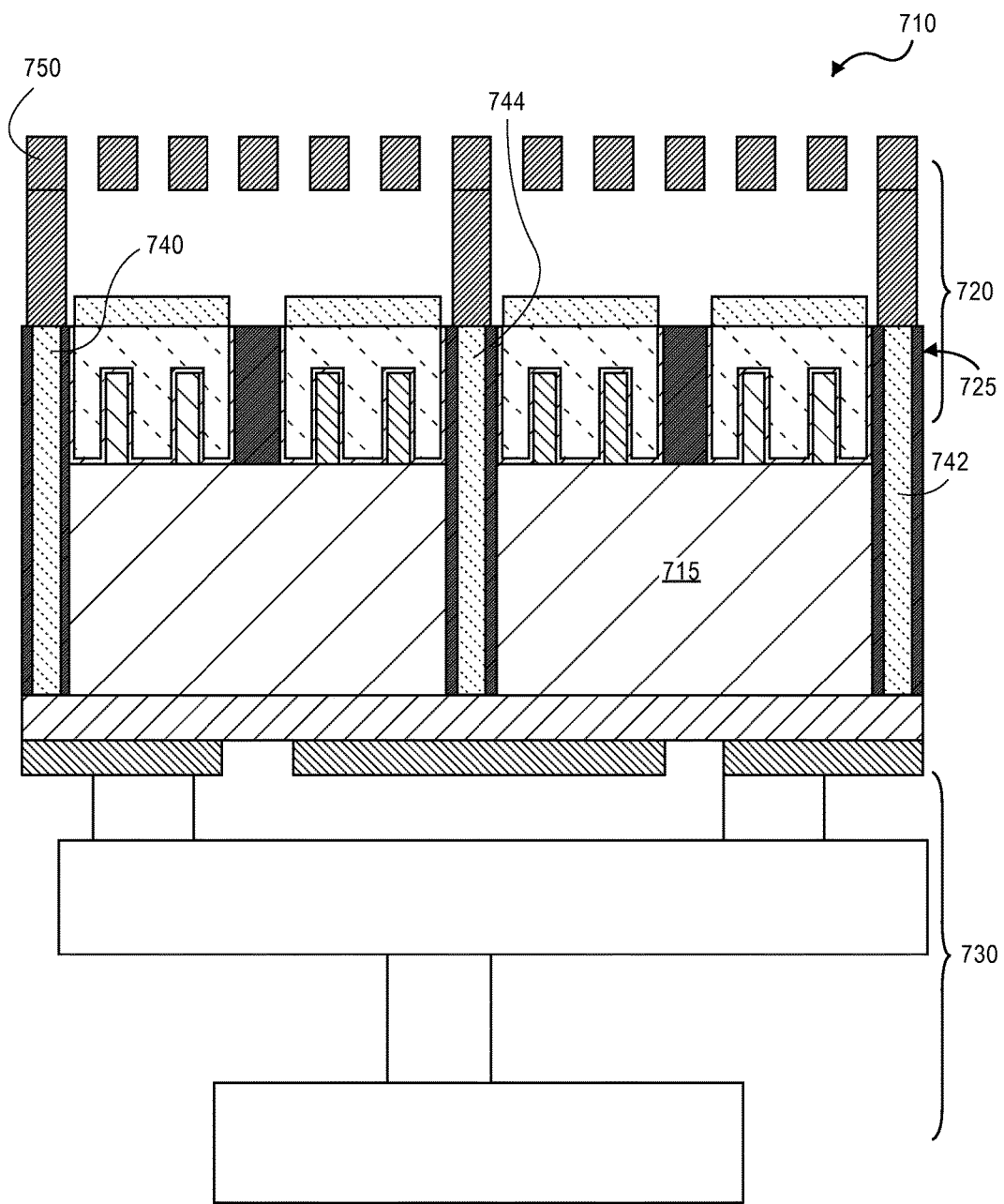
FIG. 7 shows a cross-sectional schematic side view of a portion of an integrated circuit die including backside or underside metallization in another embodiment in which power lines are routed from the backside through the device stratum to a device side for connection to devices.

FIG. 7 shows a cross-sectional schematic side view of a portion of an integrated circuit die including backside or underside metallization in another embodiment in which power lines are routed from the backside to a device side of the die. In the illustration, dielectric material layers are removed. Die 710 includes substrate 715 of a semiconductor material such as silicon. Disposed on a first side or device side 720 of substrate 715 is device layer or stratum 725 including a number of transistor devices. Disposed on a second or underside or backside of substrate 715 is backside metallization 730. In the embodiment shown in FIG. 7, conductive vias are utilized to connect backside metallization 730 (notably $V_{DD}$, $V_{DD}$-gated and $V_{SS}$) to front or device side interconnect in metallization level 750 (e.g., M0) through insulation regions of the device stratum. FIG. 7 shows via 740 and via 742 that are utilized to bring $V_{DD}$ or $V_{DD}$-gated power from the backside to the device side metallization and via 744 to connect to $V_{SS}$. The vias extend through the device stratum 742 and through the substrate. The vias may be formed in a two-step process involving forming TSVs through substrate 715 and then extending the vias through the device stratum once such stratum is formed. Alternatively, the vias may formed following device formation by an etch process that extends through device stratum 725 and substrate 715 followed by a conductive deposition operation.

Figure 8:
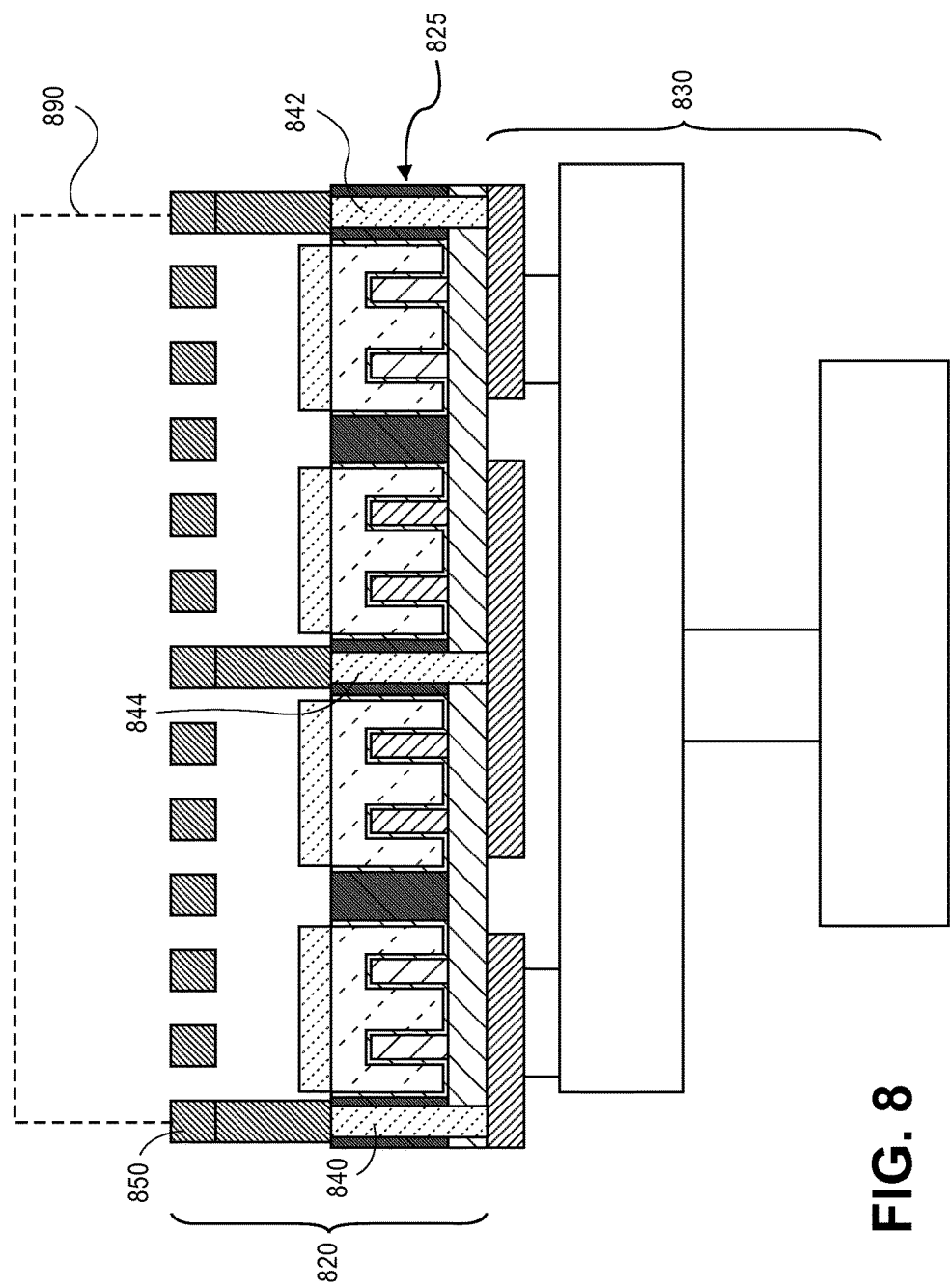
FIG. 8 shows a cross-sectional schematic side view of a portion of an integrated circuit die including backside or underside metallization in another embodiment in which power lines are routed from the backside through the device stratum to a device side for connection to devices.

FIG. 8 shows a cross-sectional schematic side view of a portion of an integrated circuit die including backside or underside metallization in another embodiment in which power lines are routed from the backside to a device side of the die. In the illustration, dielectric material layers are again removed. According to this embodiment, the device substrate is thinned or completely removed so that backside metallization directly connects with contacts or vias through the device stratum. FIG. 8 shows die 810 including device layer or stratum 825 including a number of transistor devices and a first side or device side 820 including metallization levels (metallization level 850). Disposed on a second or underside of device stratum 825 is backside metallization 830. FIG. 8 shows contact or via 840 and contact or via 842 each connected to interconnects in metallization level 850 and extending through device stratum 825 and connected at an underside to metallization 830 to bring $V_{DD}$ or $V_{DD}$-gated power from the underside to the device side. Contact or via 844 is similarly disposed to connect to $V_{SS}$.

Figure 9:
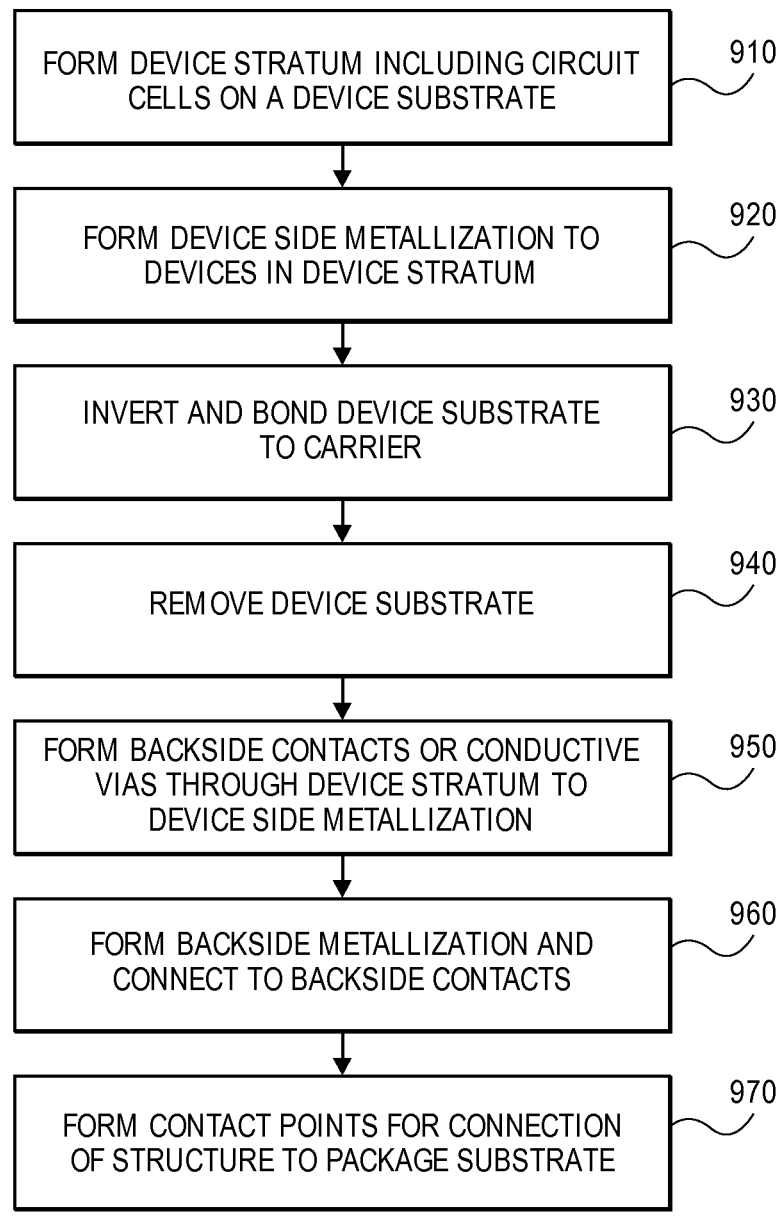
FIG. 9 is a flow chart of an embodiment of a method to form the structure illustrated in FIG. 8.

FIG. 9 presents a flow chart of a method or process to form a structure such as described in the embodiment of FIG. 8. Referring to FIG. 9, the method includes initially to form the device layer or stratum and metallization on the device substrate (e.g., semiconductor substrate) according to known wafer-level die fabrication methods (block 910). Desired device side metallization would then be formed to devices in the device stratum (block 920). Such metallization, in one embodiment, would not include power lines or interconnects, but would include contact points at, for example, M0 for connection to power lines. Once the device side of the die is fabricated, the die is inverted and bonded to a carrier substrate via an adhesive with device side metallization down and die substrate exposed (block 930). The die substrate is then removed by, for example, an etch or mechanical grinding process to expose an underside of the device stratum (block 940). Conductive vias or contacts are then made through the device stratum into insulated regions in cells for power connections (block 950). Following the formation of the vias or contacts, backside metallization is formed and connected to the contacts to route power (block 960). Contacts, such as C4 bumps are then added for connection of the die to an external source (e.g., a package substrate) for power connection (block 970).

Figure 10:
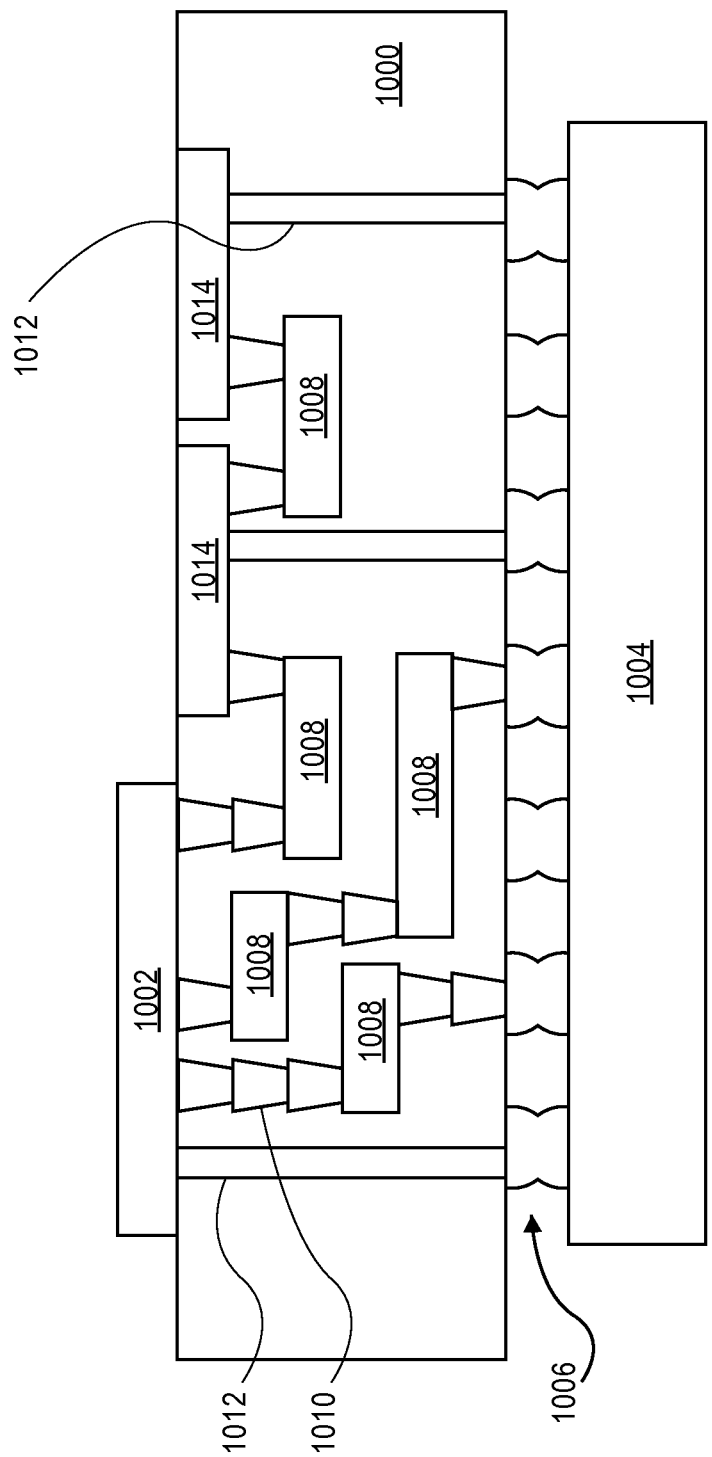
FIG. 10 is an interposer implementing one or more embodiments.

FIG. 10 illustrates interposer 1000 that includes one or more embodiments. Interposer 1000 is an intervening substrate used to bridge a first substrate 1002 to second substrate 1004. First substrate 1002 may be, for instance, an integrated circuit die. Second substrate 1004 may be, for instance, a memory module, a computer motherboard, or another integrated circuit die. Generally, the purpose of interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of interposer 1000. In other embodiments, the first and second substrates 1002/1004 are attached to the same side of interposer 1000. In further embodiments, three or more substrates are interconnected by way of interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 1000. In accordance with embodiments, apparatuses or processes disclosed herein may be used in the fabrication of interposer 1000.

Figure 11:
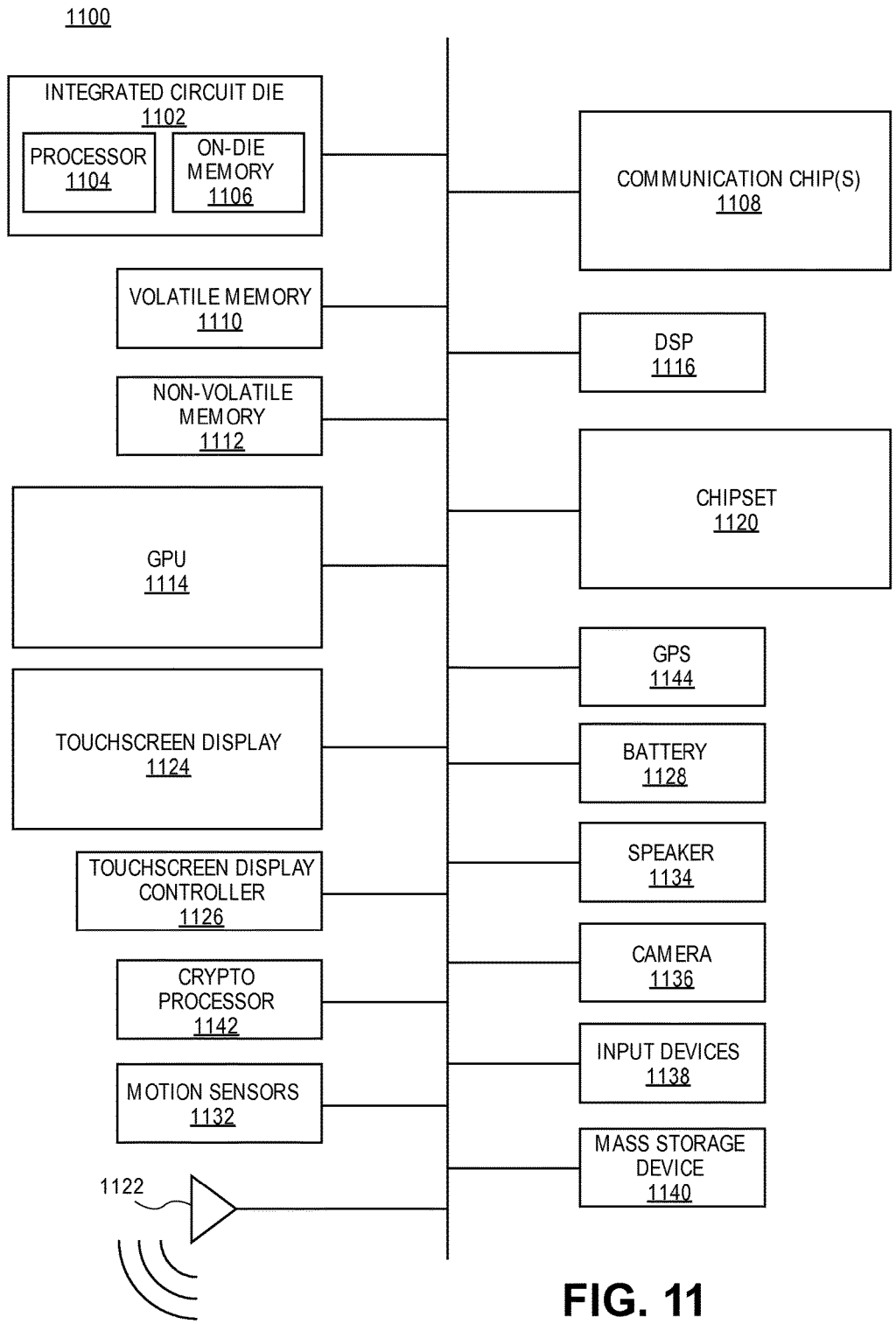
FIG. 11 illustrates an embodiment of a computing device.

FIG. 11 illustrates a computing device 1100 in accordance with one embodiment. The computing device 1100 may include a number of components. In one embodiment, these components are attached to one or more motherboards. In an alternate embodiment, these components are fabricated onto a single system-on-a-chip (SoC) die rather than a motherboard. The components in the computing device 1100 include, but are not limited to, an integrated circuit die 1102 and at least one communication chip 1108. In some implementations the communication chip 1108 is fabricated as part of the integrated circuit die 1102. The integrated circuit die 1102 may include a CPU 1104 as well as on-die memory 1106, often used as cache memory, that can be provided by technologies such as embedded DRAM (eDRAM) or spin-transfer torque memory (STTM or STTM-RAM).

Computing device 1100 may include other components that may or may not be physically and electrically coupled to the motherboard or fabricated within an SoC die. These other components include, but are not limited to, volatile memory 1110 (e.g., DRAM), non-volatile memory 1112 (e.g., ROM or flash memory), a graphics processing unit 1114 (GPU), a digital signal processor 1116, a crypto processor 1142 (a specialized processor that executes cryptographic algorithms within hardware), a chipset 1120, an antenna 1122, a display or a touchscreen display 1124, a touchscreen controller 1126, a battery 1128 or other power source, a power amplifier (not shown), a global positioning system (GPS) device 1144, a compass 1130, a motion coprocessor or sensors 1132 (that may include an accelerometer, a gyroscope, and a compass), a speaker 1134, a camera 1136, user input devices 1138 (such as a keyboard, mouse, stylus, and touchpad), and a mass storage device 1140 (such as hard disk drive, compact disk (CD), digital versatile disk (DVD), and so forth).

The communications chip 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1108. For instance, a first communication chip 1108 may be dedicated to shorter range wireless communications such as Wi-Fi and Bluetooth and a second communication chip 1108 may be dedicated to longer range wireless communications such as GPS, EDGE, GPRS, CDMA, WiMAX, LTE, Ev-DO, and others.

The processor 1104 of the computing device 1100 includes one or more devices, such as transistors or metal interconnects, that are formed in accordance with embodiments including backside power routing through a device stratum and connection to devices through device side metallization. The term "processor" may refer to any device or portion of a device that processes electronic data from registers and/or memory to transform that electronic data into other electronic data that may be stored in registers and/or memory.

The communication chip 1108 may also include one or more devices, such as transistors or metal interconnects, that are formed in accordance with embodiments including backside power routing through a device stratum and connection to devices through device side metallization.

In further embodiments, another component housed within the computing device 1100 may contain one or more devices, such as transistors or metal interconnects, that are formed in accordance with implementations including backside power routing through a device stratum and connection to devices through device side metallization.

In various embodiments, the computing device 1100 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

EXAMPLES

Example 1 is an apparatus including a circuit structure including a device stratum including a plurality of transistor devices each including a first side and an opposite second side; a supply line disposed on the second side of the device stratum; and a contact coupled to the supply line and routed through the device stratum and coupled to at least one of the plurality of transistor devices on the first side.

In Example 2, the plurality of transistor devices of the apparatus of Example 1 are arranged in a cell that performs a function and that includes an insulation region adjacent a transistor device and the contact is routed through the insulation region.

In Example 3, the insulation region of the apparatus of Example 2 includes open gate electrode region.

In Example 4, the contact of the apparatus of Example 2 is at an end of the cell.

In Example 5, the supply line of the apparatus of any of Examples 1-4 includes a positive supply line and the contact is a positive supply contact, the apparatus further including a second supply line disposed on the second side of the structure and a second supply contact coupled to the second supply line and routed through the device stratum and coupled to at least one of the plurality of transistor devices on the first side.

In Example 6, the device stratum of the apparatus of any of Examples 1-5 is disposed on a substrate and the substrate is disposed between the device stratum and the supply line.

In Example 7, the contact of the apparatus of Example 5 is routed through the substrate.

In Example 8, the contact of the apparatus of Example 5 includes a first portion routed through the substrate and a second portion routed from the substrate through the device stratum, wherein the first portion includes a larger volume than a volume of the second portion.

In Example 9, the plurality of transistor devices of the apparatus of any of Examples 1-8 are arranged in a cell that performs a function and the contact is routed to a distribution line on the first side adjacent the cell.

In Example 10, the plurality of transistor devices of the apparatus of any of Examples 1-10 are arranged in a cell that performs a function and the contact is routed to the first side adjacent the cell in the form of a slot.

Example 11 is a method including providing a supply from a package substrate to at least one transistor in a device stratum of a circuit structure, the at least one transistor having a device side and an underside; and distributing the supply to the at least one transistor using a supply line on the underside of the device stratum and contacting the at least one transistor on the device side by routing a contact from the supply line through the device stratum.

In Example 12, the plurality of transistor devices of the method of Example 11 are arranged in a cell that performs a function and that includes an insulation region adjacent a transistor device and routing the contact through the device stratum includes routing the contact through the insulation region.

In Example 13, the insulation region of the method of Example 12 includes open gate electrode region.

In Example 14, the contact of the method of Example 12 is routed at an end of the cell.

In Example 15, the supply of the method of any of Examples 11-14 includes a positive supply and the contact is a positive supply contact, the method further including distributing a second supply using a second supply line disposed on the underside of the device stratum and contacting at least one transistor on the device side by routing a second supply contact from the second supply line through the device stratum.

In Example 16, the device stratum of the method of any of Examples 11-15 is disposed on a substrate and the substrate is disposed between the device stratum and the supply line.

In Example 17, the contact of the method of Example 16 is routed through the substrate.

In Example 18, the plurality of transistor devices of the method of any of Examples 11-18 are arranged in a cell that performs a function and distributing the supply to the at least one transistor includes routing the contact from the supply line to a distribution line on the device side adjacent the cell.

Example 19 is a system including a package substrate including a supply connection, and a die including the apparatus of any of Examples 1-10: (i) a plurality of transistors arranged in a cell operable to perform a function, the plurality of transistors defining a device stratum having a device side and an underside; and (ii) at least one supply line disposed on an underside of the device stratum and routed through the device stratum and coupled to at least one of the plurality of transistor devices on the device side.

In Example 20, the cell in the system of Example 19 includes an insulation region adjacent a transistor device and the contact is routed through the insulation region.

In Example 21, the insulation region in the system of Example 20 includes open gate electrode region.

In Example 22, the at least one supply line in the system of Example 20 includes a positive supply line and the contact is a positive supply contact, the system further including a second supply line disposed on the second side of the structure and a second supply contact coupled to the second supply line and routed through the device stratum and coupled to at least one of the plurality of transistor devices on the device side.

In Example 23, the device stratum in the system of any of Examples 19-22 is disposed on a substrate and the substrate is disposed between the device stratum and the at least one supply line.

In Example 24, the contact in the system of Example 23 is routed through the substrate.

In Example 25, the contact in the system of Example 23 includes a first portion routed through the substrate and a second portion routed from the substrate through the device stratum, wherein the first portion includes a larger volume than a volume of the second portion.

In Example 26, the contact in the system of Example 19 is routed to a distribution line on the first side adjacent the cell.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   a circuit structure comprising a device stratum comprising a plurality of transistor devices each comprising a first side and an opposite second side;
   a supply line disposed on the second side of the device stratum; and
   a contact coupled to the supply line and routed through the device stratum and coupled to at least one of the plurality of transistor devices on the first side, wherein the contact is a source contact or a drain contact.

2. The apparatus of claim 1, wherein the plurality of transistor devices are arranged in a cell that performs a function and that comprises an insulation region adjacent a transistor device and the contact is routed through the insulation region.

3. The apparatus of claim 2, wherein the insulation region comprises open gate electrode region.

4. The apparatus of claim 2, wherein the contact is at an end of the cell.

5. The apparatus of claim 1, wherein the supply line comprises a positive supply line and the contact is a positive supply contact, the apparatus further comprising a second supply line disposed on a second side of the structure and a second supply contact coupled to the second supply line and routed through the device stratum and coupled to at least one of the plurality of transistor devices on the first side.

6. The apparatus of claim 1, wherein the device stratum is disposed on a substrate and the substrate is disposed between the device stratum and the supply line.

7. The apparatus of claim 5, wherein the contact is routed through the substrate.

8. The apparatus of claim 5, wherein the contact comprises a first portion routed through the substrate and a second portion routed from the substrate through the device stratum, wherein the first portion comprises a larger volume than a volume of the second portion.

9. The apparatus of claim 1, wherein the plurality of transistor devices are arranged in a cell that performs a function and the contact is routed to a distribution line on the first side adjacent the cell.

10. The apparatus of claim 1, wherein the plurality of transistor devices are arranged in a cell that performs a function and the contact is routed to the first side adjacent the cell in the form of a slot.

11. A method comprising:
providing a supply from a package substrate to at least one transistor in a device stratum of a circuit structure, the at least one transistor having a device side and an underside; and
distributing the supply to the at least one transistor using a supply line on the underside of the device stratum and contacting the at least one transistor on the device side by routing a contact from the supply line through the device stratum, wherein the contact is a source contact or a drain contact.

12. The method of claim 11, wherein the at least one transistor device is arranged in a cell that performs a function and that comprises an insulation region adjacent a transistor device and routing the contact through the device stratum comprises routing the contact through the insulation region.

13. The method of claim 12, wherein the insulation region comprises open gate electrode region.

14. The method of claim 12, wherein the contact is routed at an end of the cell.

15. The method of claim 11, wherein the supply comprises a positive supply and the contact is a positive supply contact, the method further comprising distributing a second supply using a second supply line disposed on the underside of the device stratum and contacting at least one transistor on the device side by routing a second supply contact from the second supply line through the device stratum.

16. The method of claim 11, wherein the device stratum is disposed on a substrate and the substrate is disposed between the device stratum and the supply line.

17. The method of claim 16, wherein the contact is routed through the substrate.

18. The method of claim 11, wherein the at least one transistor device is arranged in a cell that performs a function and distributing the supply to the at least one transistor comprises routing the contact from the supply line to a distribution line on the device side adjacent the cell.

19. A system comprising a package substrate comprising a supply connection, and a die comprising:
(i) a plurality of transistors arranged in a cell operable to perform a function, the plurality of transistors defining a device stratum having a device side and an underside; and
(ii) at least one supply line disposed on an underside of the device stratum and routed through the device stratum and coupled to at least one of the plurality of transistor devices on the device side by a contact, wherein the contact is a source contact or a drain contact.

20. The system of claim 19, wherein the cell comprises an insulation region adjacent a transistor device and the contact is routed through the insulation region.

21. The system of claim 20, wherein the insulation region comprises open gate electrode region.

22. The system of claim 20, wherein the at least one supply line comprises a positive supply line and the contact is a positive supply contact, the system further comprising a second supply line disposed on a second side of the structure and a second supply contact coupled to the second supply line and routed through the device stratum and coupled to at least one of the plurality of transistor devices on the device side.

23. The system of claim 19, wherein the device stratum is disposed on a substrate and the substrate is disposed between the device stratum and the at least one supply line.

24. The system of claim 23, wherein the contact is routed through the substrate.

25. The system of claim 23, wherein the contact comprises a first portion routed through the substrate and a second portion routed from the substrate through the device stratum, wherein the first portion comprises a larger volume than a volume of the second portion.

26. The system of claim 19, wherein the contact is routed to a distribution line on the first side adjacent the cell.

* * * * *